United States Patent
Kim et al.

(10) Patent No.: US 7,622,765 B2
(45) Date of Patent: Nov. 24, 2009

(54) NON-VOLATILE MEMORY DEVICE AND A METHOD OF FABRICATING THE SAME

(75) Inventors: Won-joo Kim, Yongin-si (KR); Yoon-dong Park, Yongin-si (KR); Jung-hoon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 290 days.

(21) Appl. No.: 11/709,057

(22) Filed: Feb. 22, 2007

(65) Prior Publication Data
US 2007/0284632 A1    Dec. 13, 2007

(30) Foreign Application Priority Data
Jun. 9, 2006    (KR) .................... 10-2006-0052098

(51) Int. Cl.
*H01L 29/788* (2006.01)
(52) U.S. Cl. .................... 257/316; 257/324; 438/257
(58) Field of Classification Search .............. 257/316, 257/324, 401; 438/257, 287
See application file for complete search history.

(56) References Cited

U.S. PATENT DOCUMENTS

| 6,664,582 B2 | 12/2003 | Fried et al. |
| 6,876,042 B1 | 4/2005 | Yu et al. |
| 7,224,019 B2 * | 5/2007 | Hieda et al. .................. 257/315 |

* cited by examiner

*Primary Examiner*—Mark Prenty
(74) *Attorney, Agent, or Firm*—Harness, Dickey & Pierce, P.L.C.

(57) ABSTRACT

A non-volatile memory device and a method of fabricating the same are provided. A non-volatile memory device may include a semiconductor substrate including a body and at least one pair of fins vertically protruding from the body and spaced apart from each other, and at least one control gate electrode on at least portions of outer side surfaces of the at least one pair of fins and extending onto top portions of the at least one pair of fins on an angle with the at least one pair of fins. The non-volatile memory device may further include at least one pair of gate insulating layers between the at least one control gate electrode and the at least one pair of fins, and at least one pair of storage node layers between the at least one pair of gate insulating layers and at least a portion of the at least one control gate electrode. The at least one control gate electrode may extend onto top portions of the at least one pair of fins in a zigzag fashion.

24 Claims, 4 Drawing Sheets

NON-VOLATILE MEMORY DEVICE AND A METHOD OF FABRICATING THE SAME

PRIORITY STATEMENT

This application claims priority under 35 U.S.C. § 119 to Korean Patent Application No. 10-2006-0052098, filed on Jun. 9, 2006, in the Korean Intellectual Property Office (KIPO), the entire contents of which are incorporated herein by reference.

BACKGROUND

1. Field

Example embodiments relate to a non-volatile memory device and a method of fabricating the same. Other example embodiments relate to a non-volatile memory device having a fin-type channel region and a method of fabricating the same.

2. Description of the Related Art

Semiconductor products may have smaller volumes and may process a larger capacity of data. Methods of increasing operation speeds and integration of non-volatile memory devices used in such semiconductor products have been developed. For example, fin-field effect transistors (fin-FETs) may be used to increase their operation speeds, and widths of the fins thereof may be reduced to further increase integration. Fin-FETs using silicon-on-insulator (SOI) substrates are expected to further improve short channel effects. For example, the conventional art discloses a fin-FET and fin memory cells. As another example, the conventional art discloses a fin-FET using an SOI substrate.

SOI substrates may be relatively expensive. Attempts to form fin-FETs and/or fin memory cells using SOI substrates having similar characteristics to bulk semiconductor substrates have been made. In this case, integration of semiconductor devices may be further increased. Distances between fins are becoming smaller and operation interference may occur between neighboring fins.

Figure 1:
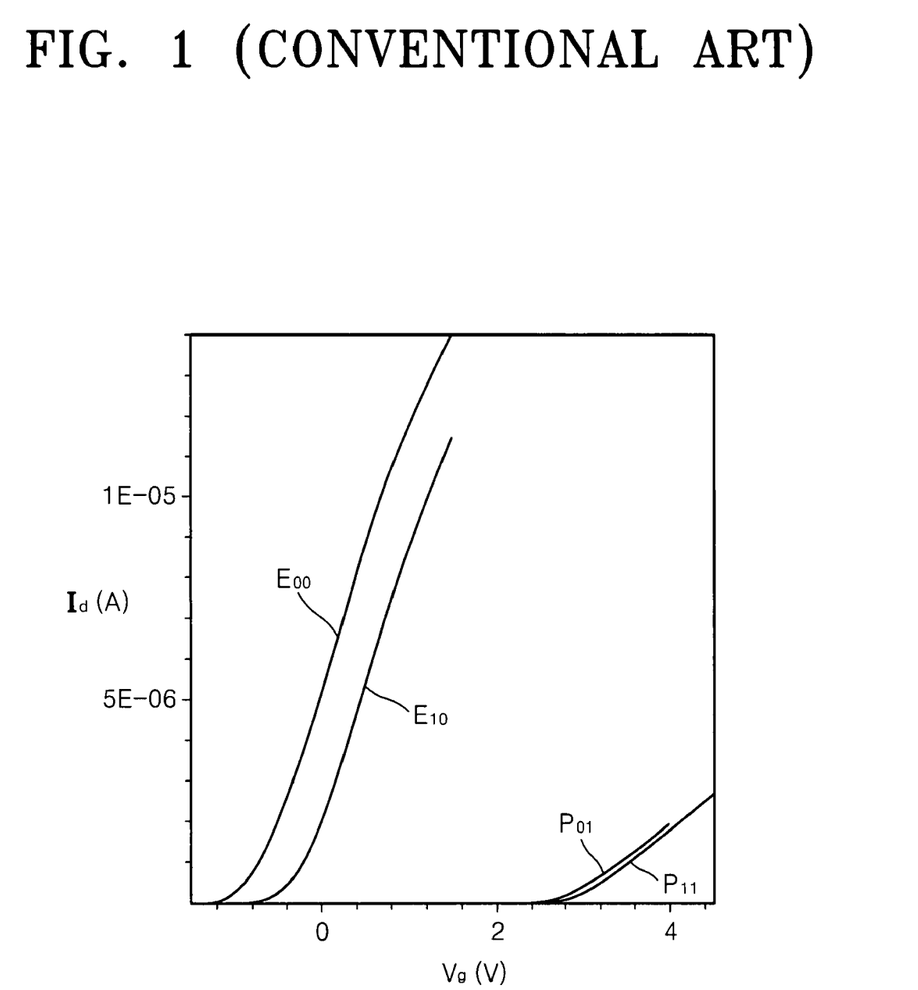
FIG. 1 is a graph illustrating interference between a pair of neighboring bit lines of a conventional non-volatile memory device during program and erasing operations.

FIG. 1 is a graph illustrating interference between a pair of neighboring bit lines of a conventional non-volatile memory device during program and erasing operations. Erased states of the bit lines are expressed by "0," program states of the bit lines are expressed by "1," a plot of an erasing operation is expressed by "E," and a plot of a program operation is expressed by "P."

Referring to FIG. 1, a state of a bit line may affect graphs $E_{00}$ and $E_{10}$ of an erasing operation of another bit line. If a bit line is in a program state $E_{10}$ not in an erased state $E_{00}$, a threshold voltage for an erasing operation of another bit line may be increased by about 0.55V. An erasing state and a program state of a bit line may not affect graphs $P_{01}$ and $P_{11}$ of a program operation of another bit line in a program operation. Interference in such an erasing operation may occur because charges of neighboring storage node layers may affect a potential of a channel region due to the proximity of neighboring bit lines. As a dielectric constant of an insulating layer between bit lines is relatively high, such interference may be further increased. Interference of an erasing operation between bit lines may limit a reduction in distance between bit lines and thus may limit an increase in integration of a non-volatile memory device.

SUMMARY

Example embodiments provide a non-volatile memory device which may be highly integrated and may reduce an interference of an erasing operation and a method of fabricating the same.

According to example embodiments, a non-volatile memory device may comprise a semiconductor substrate including a body and at least one pair of fins vertically protruding from the body and spaced apart from each other, and at least one control gate electrode on at least portions of outer side surfaces of the at least one pair of fins and extending onto top portions of the at least one pair of fins on an angle with the at least one pair of fins.

The non-volatile memory device may further include at least one pair of gate insulating layers between the at least one control gate electrode and the at least one pair of fins, and at least one pair of storage node layers between the at least one pair of gate insulating layers and at least a portion of the at least one control gate electrode. The at least one control gate electrode may extend onto top portions of the at least one pair of fins in a zigzag fashion. The non-volatile memory device may further include a buried insulating layer filling a space between the at least one pair of fins, wherein the at least one control gate electrode extends onto the buried insulating layer. The non-volatile memory device may further include a device isolation layer between the at least one control gate electrode and the body and on portions of the outer side surfaces of the at least one pair of fins other than the portions of the outer side surfaces which are on the at least one control gate electrode, the outer side surfaces being surfaces of the at least one pair of fins that do not face the buried insulating layer. The at least one pair of gate insulating layers may be on portions of the outer side surfaces of the at least one pair of fins which are the surfaces of the at least one pair of fins that do not face the buried insulating layer. The at least one pair of gate insulating layers may be on a top portion of the at least one pair of fins. The at least one pair of storage node layers may be on portions of the at least one pair of gate insulating layers which are on portions of the outer side surfaces of the at least one pair of fins.

The non-volatile memory device may further include an impurity area in the at least one pair of fins on both sides of the at least one control gate electrode. A portion of the at least one control gate electrode, extending onto the at least one pair of fins, may extend on an angle of about 45° with the at least one pair of fins. A bulk semiconductor wafer may be etched to form the semiconductor substrate. The at least one control gate electrode may include first portions extending on an angle with the at least one pair of fins and second portions perpendicular to the at least one pair of fins, wherein the first and second portions are alternately arranged. The first portions of the at least one control gate electrode may extend onto the at least one pair of fins.

According to example embodiments, a method of fabricating a non-volatile memory device may include providing a semiconductor substrate including a body and at least one pair of fins vertically protruding from the body and spaced apart from each other, and forming at least one control gate electrode on at least portions of outer side surfaces of the at least one pair of fins and extending onto top portions of the at least one pair of fins on an angle with the at least one pair of fins.

The method may further include forming at least one pair of gate insulating layers between the at least one control gate electrode and the at least one pair of fins, and forming at least one pair of storage node layers between the at least one pair of gate insulating layers and at least a portion of the at least one control gate electrode. The at least one control gate electrode may be formed to extend onto top portions of the at least one pair of fins in a zigzag fashion. The method may further include forming a buried insulating layer filling a space between the at least one pair of fins, wherein the at least one control gate electrode extends onto the buried insulating layer. The method may also further include forming a device isolation layer between the at least one control gate electrode and the body and on portions of the outer side surfaces of the at least one pair of fins other than the portions of the outer side surfaces which are on the at least one control gate electrode, the outer side surfaces being surfaces of the at least one pair of fins that do not face the buried insulating layer. The at least one pair of gate insulating layers may be formed on portions of the outer side surfaces of the at least one pair of fins which are the surfaces of the at least one pair of fins that do not face the buried insulating layer. The at least one pair of gate insulating layers may be formed on a top portion of the at least one pair of fins. The at least one pair of storage node layers may be formed on portions of the at least one pair of gate insulating layers which are formed on portions of the outer side surfaces of the at least one pair of fins.

The method may further include forming an impurity area in the at least one pair of fins on both sides of the at least one control gate electrode. A portion of the at least one control gate electrode extending onto the at least one pair of fins may extend on an angle of about 45° with the at least one pair of fins. A bulk semiconductor wafer may be etched to form the semiconductor substrate. The at least one control gate electrode may include first portions extending on an angle with the at least one pair of fins and second portions perpendicular to the at least one pair of fins, wherein the first and second portions are alternately arranged. The first portions of the at least one control gate electrode may extend onto the at least one pair of fins.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
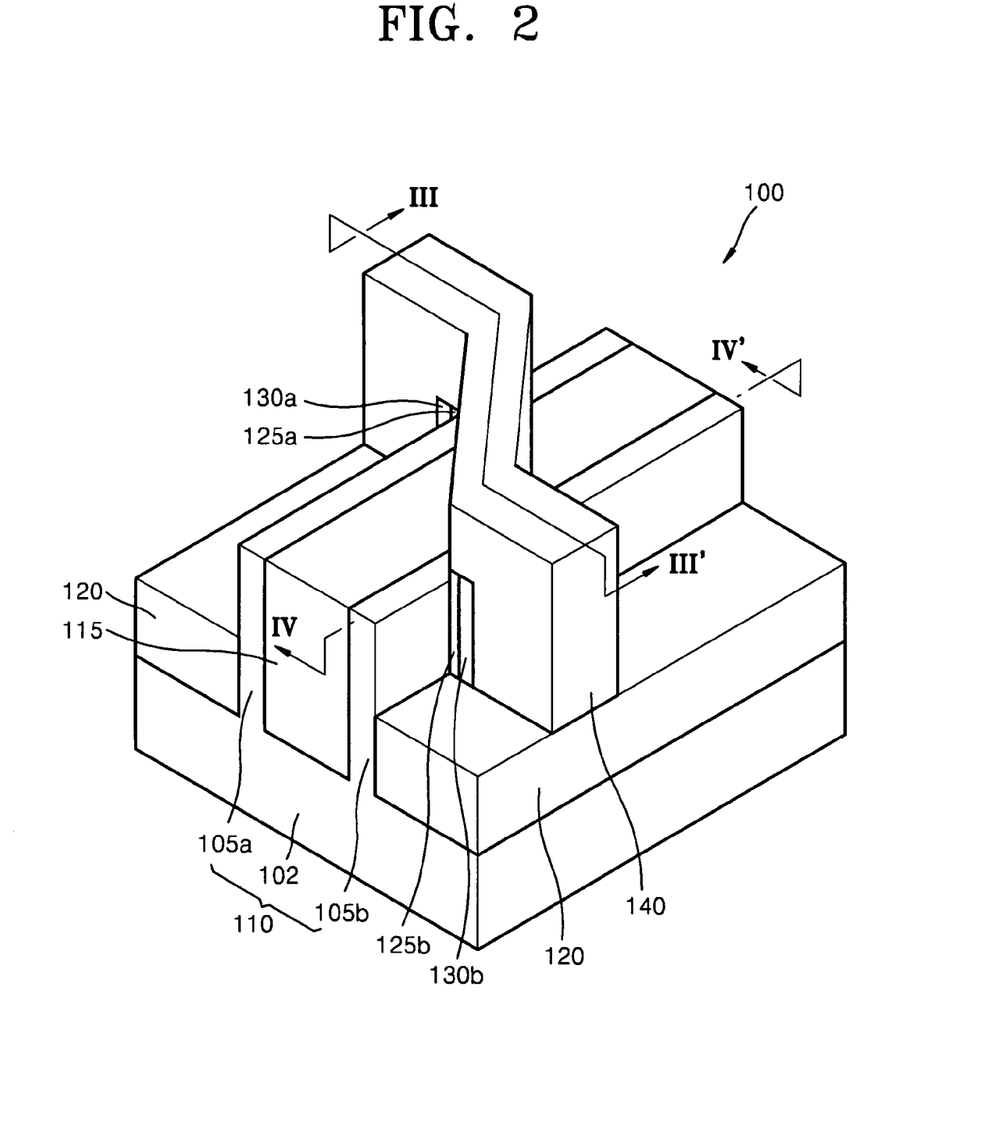
FIG. 2 is a perspective view illustrating a non-volatile memory device according to example embodiments.
Figure 3:
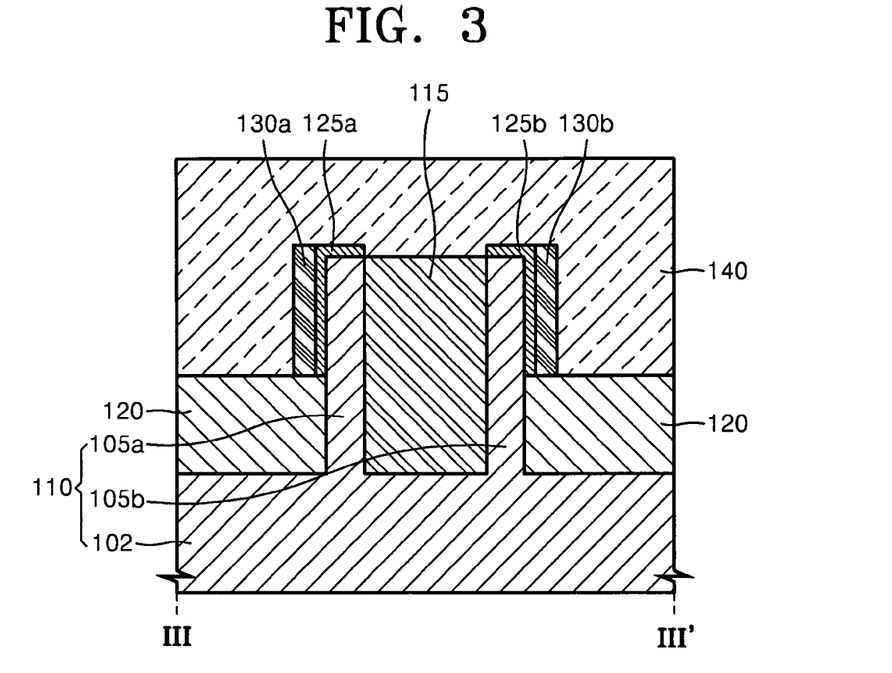
FIG. 3 is a cross-sectional view taken along line III-III' of FIG. 2.
Figure 4:
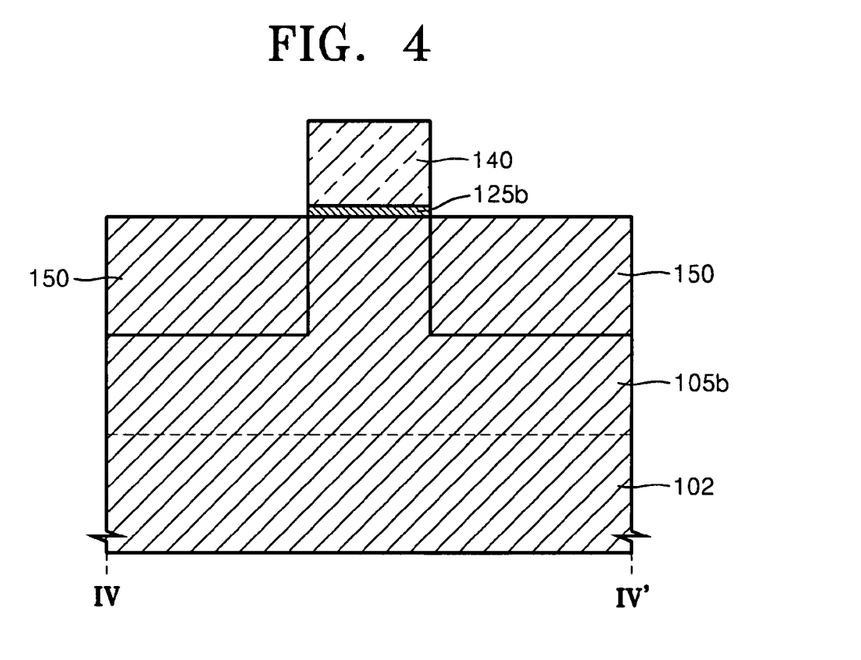
FIG. 4 is a cross-sectional view taken along line IV-IV' of FIG. 2.

FIG. 2 is a perspective view illustrating a non-volatile memory device 100 according to example embodiments. FIG. 3 is a cross-sectional view taken along line III-III' of FIG. 2, and FIG. 4 is a cross-sectional view taken along line IV-IV' of FIG. 2. For example, the non-volatile memory device 100 according to example embodiments may be a flash memory device and/or a semiconductor-oxide-nitride-oxide-semiconductor (SONOS) memory device.

Referring to FIGS. 2-4, the non-volatile memory device 100 may include a semiconductor substrate 110, a pair of gate insulating layers 125a and 125b, a pair of storage node layers 130a and 130b and a control gate electrode 140. The non-volatile memory device 100 may further include a buried insulating layer 115 and a device isolation layer 120. A structure of the non-volatile memory device 100 will now be described in more detail.

The semiconductor substrate 110 may include a body 102 and a pair of fins 105a and 105b. The fins 105a and 105b may vertically protrude from the body 102 and are spaced apart and facing each other. For example, a semiconductor wafer, for example, a silicon wafer, a germanium wafer and/or a silicon-germanium wafer, may be etched to form the semiconductor substrate 110. The fins 105a and 105b may be formed of the same material as that of which the body 102 is to be formed. According to example embodiments, the fins 105a and 105b may be formed as an epitaxial layer on the body 102.

The buried insulating layer 115 fills a space between the fins 105a and 105b. For example, the buried insulating layer 115 may fill a space between inner surfaces of the fins 105a and 105b and the body 102. For example, an insulating layer may be formed in the space and then planarized to form the buried insulating layer 115 so as to fill the space between the fins 105a and 105b. The buried insulating layer 115 may include an oxide layer and/or a nitride layer. According to example embodiments, the buried insulating layer 115 may physically connect only an upper side portion of inner surfaces of both fins 105a and 105b. A void, e.g., an empty space (not shown), may be defined between the buried insulating layer 115 and the body 102.

The control gate electrode 140 may be on at least portions of outer surfaces of the fins 105a and 105b and may extend onto top portions of the fins 105a and 105b on an angle. The outer surfaces of the fins 105a and 105b may refer to the surfaces opposite to the inner surfaces of the fins 105a and 105b which are forming portions of the buried insulating layer 115. A portion of the control gate electrode 140 disposed on the fins 105a and 105b may be on an angle to the fins 105a and 105b, e.g., may not be perpendicular to the fins 105a and 105b. The angle between the control gate electrode 140 and the fins 105a and 105b may be larger than about 0° and smaller than about 90°, for example, about 45° for symmetry.

A portion of the control gate electrode 140 above the buried insulating layer 115 may extend onto an upper surface of the buried insulating layer 115. A portion of the control gate electrode 140, disposed on the outer surfaces of the fins 105a and 105b, may cover the upper portions of the outer surfaces of the fins 105a and 105b. The portion of the control gate electrode 140, disposed on the outer surfaces of the fins 105a and 105b, may be perpendicular to the fins 105a and 105b. According to example embodiments, the portion of the control gate electrode 140, disposed on the outer surfaces of the fins 105a and 105b, may also be on an angle to the fins 105a and 105b, e.g., not perpendicular to the fins 105a and 105b. For example, a conductive layer may be formed and patterned on an angle to the fins 105a and 105b to form the control gate electrode 140. The control gate electrode 140 may include at least one of a polysilicon layer, a metal layer and/or a metal silicide layer.

The device isolation layer 120 may be on lower portions of the outer surfaces of the fins 105a and 105b. The device isolation layer 120 may isolate the control gate electrode 140 from the body 102. For example, an insulating layer may be formed and etched back on the body 102 to form the device isolation layer 120 so as to be on lower side portions of the outer surfaces of the fins 105a and 105b. The device isolation layer 120 may include an oxide layer and/or a nitride layer. The gate insulating layers 125a and 125b may be interposed or inserted between the control gate electrode 140 and the fins 105a and 105b. For example, the gate insulating layers 125a and 125b may be on outer surfaces of the fins 105a and 105b not covered by the device isolation layer 120. The gate insulating layers 125a and 125b may be further formed on top portions of the fins 105a and 105b.

The gate insulating layers 125a and 125b may be tunneling paths of charges and thus may be called tunneling insulating layers. For example, the gate insulating layers 125a and,125b may include at least one of an oxide layer, a nitride layer and/or a high-k dielectric layer. The gate insulating layers 125a and 125b may be formed using a thermal oxidation method and/or a chemical vapor deposition (CVD) method. The storage node layers 130a and 130b may be interposed or inserted between the gate insulating layers 125a and 125b and the control gate electrode 140. For example, the storage node layers 130a and 130b may be formed on portions of the gate insulating layers 125a and 125b on the outer surfaces of the fins 105a and 105b. The storage node layers 130a and 130b may be used as storage layers for storing charges. For example, the storage node layers 130a and 130b may be formed as sidewall spacers of the fins 105a and 105b using material layer deposition and anisotropic etching.

For example, the storage node layers 130a and 130b may include at least one of polysilicon, silicon germanium, silicon dots, metal dots, silicon nanocrystal, metal nanocrystal and/or silicon nitride. If the storage node layers 130a and 130b include polysilicon or silicon germanium, the storage node layers 130a and 130b may be used as floating layers of a flash memory device. If the storage node layers 130a and 130b include silicon dots, metal dots, silicon nanocrystal, metal nanocrystal, or silicon nitride, the storage node layers 130a and 130b may be used as trap layers of an SONOS memory device.

An impurity area 150 may be formed in portions of fins 105a and 105b on both sides of the control gate electrode 140. The impurity area 150 may include source and drain areas. The impurity area 150 may have a diode junction with the body 102 and/or the fins 105a and 105b. For example, if the impurity area 150 is doped with n-type impurities, the fins 105a and 105b and/or the body 102 may be doped with p-type impurities. If the impurity area 150 is doped with p-type impurities, the fins 105a and 105b and/or the body 102 may be doped with n-type impurities. The non-volatile memory device 100 may further include a blocking insulating layer (not shown) formed between the control gate electrode 140 and the storage node layers 130a and 130b. If the storage node layers 130a and 130b are formed of a conductive material, e.g., polysilicon and/or silicon-germanium, the blocking insulating layer may be needed. For example, the blocking insulating layer may include an oxide layer, a nitride layer and/or a high-k dielectric layer.

The operation of the non-volatile memory device 100 according to example embodiments will now be described. In the non-volatile memory device 100, the fins 105a and 105b may be used as bit lines, and the control gate electrode 140 may be used as a word line. A channel region (not shown) may be formed to surround surfaces of the fins 105a and 105b underneath the control gate electrode 140. An operation voltage, for example, a program voltage and/or an erasing voltage, may be applied to the control gate electrode 140 to inject charges into the storage node layers 130a and 130b and/or remove injected charges. If the non-volatile memory device 100 is viewed in a horizontal direction of the fins 105a and 105b, the non-volatile memory device 100 may have a structure in which the buried insulating layer 115, one of the fins 105a and 105b, and the control gate electrode 140 are disposed. If the non-volatile memory device 100 is viewed in a horizontal direction of the fins 105a and 105b, the non-volatile memory device 100 may have a similar structure to an SOI.

A depletion region formed on portions of the fins 105a and 105b surrounding the impurity area 150 may be highly limited. As the fins 105a and 105b become thinner, the depletion region may be further limited. The depletion region may be better limited toward the outer ends of the fins 105a and 105b in a horizontal direction but may be formed only along a vertical direction of the fins 105a and 105b. If the fins 105a and 105b become thinner, the depletion region formed along the vertical direction of the fins 105a and 105b may be reduced. The non-volatile memory device 100 may inhibit a short channel effect and may reduce a leakage current as in a conventional SOI structure. The non-volatile memory device 100 may apply a bias voltage to the body 102 to adjust a threshold voltage different from the conventional SOI structure.

The control gate electrode 140, disposed on an angle to the fins 105a and 105b, may allow a distance between neighboring bit lines, e.g., channel areas (not shown), formed in the fins 105a and 105b, to be larger than in a conventional orthogonal structure. A distance between the storage node layers 130a and 130b, formed next to the control gate electrode 140, may become larger. A distance from the first storage node layer 130a to the channel region of the second fin 105b or a distance from the second storage node layer 130b to the channel region of the first fin 105a may become larger. The effect of potentials of charges stored in the storage node layers 130a and 130b in a neighboring channel region may be reduced.

Accordingly, as the effect of potentials between neighboring bit lines is reduced, interference may be reduced during operations of the neighboring bit lines. Interference occurring during the erasing operation described with reference to FIG. 1 may be reduced. If bit lines, e.g., the fins 105a and 105b, are adjacent to each other, the reliability of the operation of the non-volatile memory device 100 may be improved. Accordingly, the fins 105a and 105b may be disposed next to each other so as to keep the higher operation reliability and so as to improve integration of the non-volatile memory device 100.

Figure 5:
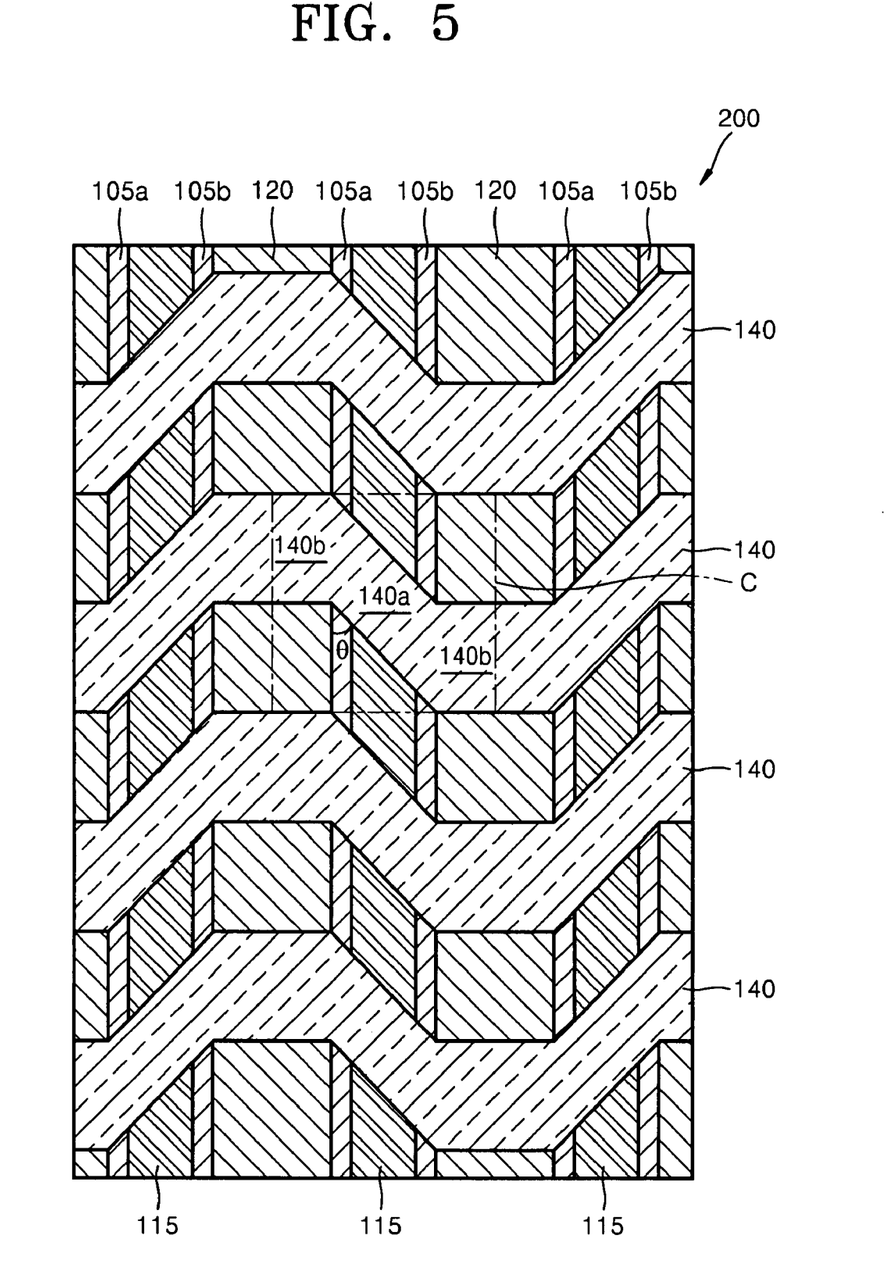
FIG. 5 is a plan view illustrating a non-volatile memory device according to example embodiments.

FIG. 5 is a plan view illustrating a non-volatile memory device 200 according to example embodiments. For example, non-volatile memory devices as shown in FIG. 4 may be connected to one another as NAND types to constitute the non-volatile memory device 200. In FIG. 5, a repeated cell structure C of the non-volatile memory device 200 may be marked with dotted lines. The repeated cell structure C marked by the dotted lines may correspond to the non-volatile memory device 100. The non-volatile memory device 200 may be understood as repeated structures of the non-volatile memory device 100. In the two embodiments, descriptions of repeated parts will be omitted, and like reference numerals denote the same elements.

Referring to FIG. 5, a semiconductor substrate may include a plurality of pairs of fins 105a and 105b. Structures of the pairs of fins 105a and 105b may be as shown in FIGS. 2-4. The plurality of pairs of fins 105a and 105b may protrude from the body 102 of the semiconductor substrate 110 and may be spaced apart from one another to facing each other as shown in FIGS. 2-4.

A plurality of control gate electrodes 140 may extend onto the top of the plurality of pairs of fins 105a and 105b in a zigzag fashion and may be on at least portions of outer surfaces of each plurality of pairs of fins 105a and 105b. As shown in FIGS. 2-4, portions of the control gate electrodes 140 may be on upper portions of the outer surfaces of the plurality of pairs of fins 105a and 105b. The extending of the plurality of control gate electrodes 140 in the zigzag fashion means that the plurality of control gate electrodes 140 may extend in many directions without intersecting with one another, each control gate electrode 140 including left angled sections and right angled sections. Each control gate electrode 140 also may include straight sections disposed between consecutive left and right angled sections. The plurality of control gate electrodes 140 may have a structure in which left angled sections, horizontal sections, right angled sections, and horizontal sections are repeated. In the structure of the plurality of control gate electrodes 140, left angled sections and right angled sections may be intersected by the fins 105a and 105b, and left angled sections, horizontal sections, and right angled sections and horizontal sections are repeated.

The control gate electrodes 140 may include a structure in which first portions 140a extending on an angle to the fins 105a and 105b and second portions 140b extending perpendicular to the fins 105a and 105 are alternately arranged. The first portions 140a may be portions extending onto the fins 105a and 105b. The first portions 140a may be portions extending on an angle onto the fins 105a and 105b and buried insulating layers 115.

For example, an acute angle θ between the first portions 140a and the fins 105a and 105b may be larger than about 0° and smaller than about 90°, for example, may be about 45° for symmetry. The first portions 140a may not need to be straight as shown in FIG. 5. The second portions 140b may be portions disposed on device isolation layers 120 (shown in FIG. 2) to cover the outer surfaces of the fins 105a and 105b and/or may be orthogonal to the fins 105a and 105b.

In example embodiments, the zigzag direction may not be limited to the example shown in FIG. 5. The left angled and right angled sections may be alternately disposed without the horizontal sections. For example, the first portions 140a may be inclined up to centers of the second portions 140b. As another example, the second portions 140b and the first portions 140a may intersect with one another at a different point as the one shown. A plurality of pairs of gate insulating layers (not shown) may be interposed or inserted between the plurality of control gate electrodes 140 and the plurality of pairs of fins 105a and 105b. A plurality of pairs of storage node layers may be interposed or inserted between the plurality of pairs of gate insulating layers and at least portions of the plurality of control gate electrodes 140. The structure and disposition of the gate insulating layers and the storage node layers in a unit cell C may be as described with reference to FIGS. 2-4.

Numbers of the fins 105a and 105b and the control gate electrodes 140 shown in FIG. 5 may be an example. The scope of example embodiments is not limited to the numbers thereof. The non-volatile memory device 200 may further include selection gate electrodes (not shown) forming selection transistor structures around edges of the fins 105a and 105b used as bit lines. The selection gate electrodes may have a zigzag structure like the control gate electrodes 140 but may alternatively have a linear structure without being limited to this structure.

In the non-volatile memory device 200, the length of the bit lines, e.g., the fins 105 and 105, may be larger than that of conventional memory device by about a width of one of the control gate electrodes 140, e.g., about 1 F. Increases in areas of the control gate electrodes 140 with increases in the lengths of the bit lines may be much smaller than reductions in the areas of the control gate electrodes 140 with reductions in a distance of the bit lines. The non-volatile memory device 200 may have higher integration.

While example embodiments have been particularly shown and described with reference to example embodiments thereof, it will be understood by those of ordinary skill in the art that various changes in form and details may be made therein without departing from the spirit and scope of the following claims.

What is claimed is:

1. A non-volatile memory device comprising:
a semiconductor substrate including a body and at least one pair of fins vertically protruding from the body arid spaced apart from each other; and
at least one control gate electrode on at least portions of outer side surfaces of the at least one pair of fins and extending onto top portions of the at least one pair of fins on an angle with the at least one pair of fins,
wherein the at least one control gate electrode extends onto top portions of the at least one pair of fins in a zigzag fashion.

2. The non-volatile memory device of claim 1, further comprising:
at least one pair of gate insulating layers between the at least one control gate electrode and the at least one pair of fins; and
at least one pair of storage node layers between the at least one pair of gate insulating layers and at least a portion of the at least one control gate electrode.

3. A non-volatile memory device comprising:
a semiconductor substrate including a body and at least one pair of fins vertically protruding from the body and spaced apart from each other;
at least one control gate electrode on at least portions of outer side surfaces of the at least one pair of fins and extending onto top portions of the at least one pair of fins on an angle with the at least one pair of fins; and
a buried insulating layer filling a space between the at least one pair of fins, wherein the at least one control gate electrode extends onto the buried insulating layer.

4. The non-volatile memory device of claim 3, further comprising:
a device isolation layer between the at least one control gate electrode and the body and on portions of the outer side surfaces of the at least one pair of fins other than the portions of the outer side surfaces which are on the at least one control gate electrode, the outer side surfaces being surfaces of the at least one pair of fins that do not face the buried insulating layer.

5. The non-volatile memory device of claim 3, further comprising:
at least one pair of gate insulating layers on portions of the outer side surfaces of the at least one pair of fins which are the surfaces of the at least one pair of fins that do not face the buried insulating layer.

6. The non-volatile memory device of claim 5, wherein the at least one pair of gate insulating layers are on a top portion of the at least one pair of fins.

7. The non-volatile memory device of claim 2, wherein the at least one pair of storage node layers are on portions of the at least one pair of gate insulating layers which are on portions of the outer side surfaces of the at least one pair of fins.

8. The non-volatile memory device of claim 1, further comprising:
an impurity area in the at least one pair of fins on both sides of the at least one control gate electrode.

9. The non-volatile memory device of claim 1, wherein a portion of the at least one control gate electrode extending onto the at least one pair of fins extends on an angle of about 45° with the at least one pair of fins.

10. The non-volatile memory device of claim 1, wherein a bulk semiconductor wafer is etched to form the semiconductor substrate.

11. The non-volatile memory device of claim 1, wherein the at least one control gate electrode includes first portions extending on an angle with the at least one pair of fins and second portions perpendicular to the at least one pair of fins, wherein the first and second portions are alternately arranged.

12. The non-volatile memory device of claim 11, wherein the first portions of the at least one control gate electrode extends onto the at least one pair of fins.

13. A method of fabricating a non-volatile memory device comprising:
providing a semiconductor substrate including a body and at least one pair of fins vertically protruding from the body and spaced apart from each other; and
forming at least one control gate electrode on at least portions of outer side surfaces of the at least one pair of fins and extending onto top portions of the at least one pair of fins on an angle with the at least one pair of fins,
wherein the at least one control gate electrode is formed to extend onto top portions of the at least one pair of fins in a zigzag fashion.

14. The method of claim 13, further comprising:
forming at least one pair of gate insulating layers between the at least one control gate electrode and the at least one pair of fins; and
forming at least one pair of storage node layers between the at least one pair of gate insulating layers and at least a portion of the at least one control gate electrode.

15. The method of claim 14, further comprising:
forming a buried insulating layer filling a space between the at least one pair of fins, wherein the at least one control gate electrode extends onto the buried insulating layer.

16. The method of claim 15, further comprising:
forming a device isolation layer between the at least one control gate electrode and the body and on portions of the outer side surfaces of the at least one pair of fins other than the portions of the outer side surfaces which are on the at least one control gate electrode, the outer side surfaces being surfaces of the at least one pair of fins that do not face the buried insulating layer.

17. The method of claim 15, wherein the at least one pair of gate insulating layers are formed on portions of the outer side surfaces of the at least one pair of fins which are the surfaces of the at least one pair of fins that do not face the buried insulating layer.

18. The method of claim 17, wherein the at least one pair of gate insulating layers are formed on a top portion of the at least one pair of fins.

19. The method of claim 14, wherein the at least one pair of storage node layers are formed on portions of the at least one pair of gate insulating layers which are formed on portions of the outer side surfaces of the at least one pair of fins.

20. The method of claim 13, further comprising:
forming an impurity area in the at least one pair of fins on both sides of the at least one control gate electrode.

21. The method of claim 13, wherein a portion of the at least one control gate electrode extending onto the at least one pair of fins extends on an angle of about 45° with the at least one pair of fins.

22. The method of claim 13, wherein a bulk semiconductor wafer is etched to form the semiconductor substrate.

23. The non-volatile memory device of claim 13, wherein the at least one control gate electrode includes first portions extending on an angle with the at least one pair of fins and second portions perpendicular to the at least one pair of fins, wherein the first and second portions are alternately arranged.

24. The non-volatile memory device of claim 23, wherein the first portions of the at least one control gate electrode extends onto the at least one pair of fins.

* * * * *